United States Patent
Tichauer

(10) Patent No.: US 6,800,915 B2
(45) Date of Patent: *Oct. 5, 2004

(54) PUSH-PULL CONFIGURATIONS FOR SEMICONDUCTOR DEVICE HAVING A PN-JUNCTION WITH A PHOTOSENSITIVE REGION

(75) Inventor: Larry M. Tichauer, La Palma, CA (US)

(73) Assignee: Ophir RF, Inc., Los Angeles, CA (US)

( * ) Notice: Subject to any disclaimer, the term of this patent is extended or adjusted under 35 U.S.C. 154(b) by 149 days.

This patent is subject to a terminal disclaimer.

(21) Appl. No.: 10/071,789

(22) Filed: Feb. 6, 2002

(65) Prior Publication Data

US 2002/0130381 A1 Sep. 19, 2002

Related U.S. Application Data

(63) Continuation of application No. 09/576,647, filed on May 22, 2000, now Pat. No. 6,359,324, which is a continuation-in-part of application No. 09/532,581, filed on Mar. 22, 2000, now Pat. No. 6,410,970.

(51) Int. Cl.⁷ .............................................. H01L 31/06
(52) U.S. Cl. ...................... 257/462; 257/257; 257/431; 257/458; 257/461
(58) Field of Search ................................ 257/113, 257, 257/431, 458, 461, 462; 250/210, 338.4

(56) References Cited

U.S. PATENT DOCUMENTS

| | | | |
|---|---|---|---|
| 4,107,721 A | | 8/1978 | Miller |
| 4,651,180 A | | 3/1987 | Nishizawa et al. |
| 5,739,561 A | | 4/1998 | Wennekers |
| 6,285,040 B1 | | 9/2001 | Sanada |
| 6,359,324 B1 | * | 3/2002 | Tichauer ..................... 257/462 |
| 6,410,970 B1 | * | 6/2002 | Tichauer ..................... 257/458 |

* cited by examiner

*Primary Examiner*—Allan R. Wilson
*Assistant Examiner*—N. Drew Richards
(74) *Attorney, Agent, or Firm*—Blakely, Sokoloff, Taylor & Zafman LLP

(57) ABSTRACT

A semiconductor device that has a p-n junction with a photosensitive region partially having a diffusion region and a non-diffused region when the p-n junction is subjected to a reverse bias voltage. When an incident light (e.g. a laser) is directed at the surface of the photosensitive region, hole-electron pairs are generated in the partial diffusion region within the photosensitive region. As a result, the current through the photosensitive region changes in a substantially linear fashion with the intensity of the incident light. The semiconductor device can be configured in a circuit to provide substantially linear power amplification. The semiconductor device can be configured by itself or with a complimentary device to form push-pull operations.

17 Claims, 5 Drawing Sheets

PUSH-PULL CONFIGURATIONS FOR SEMICONDUCTOR DEVICE HAVING A PN-JUNCTION WITH A PHOTOSENSITIVE REGION

CROSS REFERENCE TO A RELATED APPLICATION

This is a continuation patent application of Ser. No. 09/576,647, flied on May 22, 2000, now U.S. Pat. No. 6,359,324 entitled "PUSH-PULL CONFIGURATIONS FOR SEMICONDUCTOR DEVICE HAVING A PN-JUNCTION WITH A PHOTOSENSITIVE REGION," which is a continuation-in-patent application of Ser. No. 09/532,581, filed on March 22, 2000, now U.S. Pat. No. 6,410,970 entitled "SEMICONDUCTOR DEVICE HAVING A PN-JUNCTION WITH A PHOTOSENSITIVE REGION."

FIELD OF THE INVENTION

This invention relates generally to semiconductor devices, and in particular, a semiconductor device having a p-n junction with a photosensitive region that can be modulated with an optical source to generate hole-electron pairs from a partial depletion region formed within the photosensitive region when the p-n junction is subjected to a reverse bias voltage. The generation of hole electron pairs in the photosensitive region causes current to flow between the p-n junction. The semiconductor device is particularly useful for power amplification, and has improved linearity.

BACKGROUND OF THE INVENTION

Linearity in radio frequency (RF)/microwave power amplifiers is an important characteristic in the design of these devices. Poor linearity in power amplifiers can have many adverse effects. For instance, poor linearity can result in harmonic, intermodulation, and signal compression distortions, to name a few. Thus, designers of power amplifiers continue to develop new techniques for improving the linear characteristic of power amplifiers.

Traditionally, two types of field effect transistors have been used for RF/microwave power amplifications. These are the metal-oxide semiconductor field effect transistor (MOSFET) and the gallium-arsenide Metal-semiconductor field effect transistor (GaAs MESFET). MOSFETs are used in power amplification purposes because they are typically easier to manufacturer and are less expensive. However, they have poor linear characteristics which requires linearization compensation which adds to the cost and efficiency of the overall product. GaAs MESFETs, on the other hand, are more frequently employed for RF/microwave power amplification applications due to their improved linearity characteristic over MOSFETs. However, they are typically expensive due to complexity in their manufacturing processes.

Thus, there is a need for a new semiconductor device that uses MOSFET technology for manufacturing purposes in order to reduce cost, but has improved linearity such as that provided by GaAs MESFETs.

SUMMARY OF THE INVENTION

One aspect of the invention includes a semiconductor device that has a p-n junction with a photosensitive region partially having a depletion region and a non-depletion region when the p-n junction is subjected to a reverse bias voltage. When an incident light (e.g. a laser) is directed at the surface of the photosensitive region, hole-electron pairs are generated within the depleted region within the photosensitive region. As a result, the current through photosensitive region occurs which varies in a substantially linear fashion with the intensity of the incident light. The semiconductor device can be configured in a circuit to provide substantially linear power amplification.

A more specific exemplary embodiment of the semiconductor device comprises a substrate, n-doped and p-doped regions within the substrate, and a channel formed between the n-doped and p-doped regions. As with all p-n junction, a depletion region exists within the channel when a reverse bias voltage is applied across the p-n junction. The semiconductor device further includes a photosensitive region situated within the channel in a manner that it includes a boundary of the depletion region when the reverse bias voltage is applied across the p-n junction. The partial depletion region within the photosensitive region generates hole-electron pairs in response to an incident light upon the photosensitive region.

A more broader concept of the invention includes a semiconductor device having a substrate including a channel for conduction of current, wherein the channel includes a depletion region during the conduction of current (the depletion region exists with or without current flow), a photosensitive region situated within the channel in a manner that it includes a boundary of the depletion region during the conduction of current. Hole-electron pairs are generated within the depletion region within the photosensitive region in response to an incident light upon the photosensitive region. The device need not be limited to reverse bias diode configuration, and can encompass other configurations.

Another aspect of the invention includes an amplifier that uses the semiconductor device of the invention. The amplifier comprises a modulator for modulating a light with an input signal and a semiconductor device in accordance with the invention. The semiconductor device receives the modulated light signal which modulates the current through the semiconductor device. The semiconductor device is connected across a bias voltage with a series bias impedance to generate current through the semiconductor device. The current generates an output voltage that is an amplified version of the input signal.

Another aspect of the invention includes a complimentary device having a p-channel photosensitive semiconductor device in accordance with the invention and an n-channel photosensitive semiconductor device in accordance with the invention. An optic fiber channel is provided to couple an optical signal to respective photosensitive regions of the p-channel and n-channel devices. The p-doped region of the p-channel device and the n-doped region of the n-channel device are electrically coupled to the same potential, preferably a ground potential. The p-channel device is biased with a positive voltage (+Vd) through a series resistive element, and the n-channel device is biased with a negative voltage (−Vd) also through a series impedance element. When an optical signal is applied to the complimentary devices by way of the optical fiber or lens, the complimentary devices operate in a push-pull manner. The complimentary devices can be used for many applications.

Another aspect of the invention includes a complimentary device having a p-channel photosensitive semiconductor device in accordance with the invention and an n-channel photosensitive semiconductor device in accordance with the invention. An optic fiber channel is provided to couple an optical signal to respective photosensitive regions of the p-channel and n-channel devices. A first impedance element is connected to the n-doped region of the p-channel device at one end, and to the n-doped region of the n-channel device at the other end. A second impedance element is connected to the p-doped region of the p-channel device at one end, and to the p-doped region of the n-channel device at the other end. A first bias voltage is applied to the n-doped region of the n-channel device, and a second bias voltage is applied to the p-doped region of the p-channel device. The first bias voltage is more positive than the second bias voltage. Preferably, the second bias voltage is at ground potential. When an optical signal is applied to the complimentary devices by way of the optical fiber or lens, the complimentary devices operate in a push-pull manner.

Another aspect of the invention includes a semiconductor device configured for a push-pull operation. The semiconductor device includes a p-n junction with a photosensitive semiconductor material in accordance with the invention. An optic fiber channel is provided to couple an optical signal to the photosensitive region of the device. A first impedance element is connected to the n-doped region of the device, and second impedance element is connected to the p-doped region of the device. A first bias voltage is applied to the n-doped region by way of the first impedance device, and a second bias voltage is applied to the p-doped region by way of the second impedance device. The first bias voltage is more positive than the second bias voltage. Preferably, the second bias voltage is at ground potential. When an optical signal is applied to the device by way of the optical fiber or lens, the device causes opposite flowing currents through the first and second impedance elements to effect the push-pull operation.

Other aspects of the invention will become apparent in view of the following detailed discussion of the invention.

DETAILED DESCRIPTION OF THE INVENTION

The general concept regarding the invention is a semiconductor device that has a p-n junction with a photosensitive region partially having a diffusion region and a non-diffused region when the p-n junction is subjected to a reverse bias voltage. When an incident light (e.g. a laser) is directed at the surface of the photosensitive region, hole-electron pairs proportional to the amount of light impinging the photosensitive region are generated. As a result, the current through the photosensitive region changes in a substantially linear fashion with the intensity of the incident light.

The linearity characteristic of this semiconductor device comes about because the diffusion region other than within the photosensitive region is saturated. Thus, as the voltage across the p-n junction varies, the resistance of the channel insubstantially varies. Therefore, most of the variations of the channel resistance comes from the hole-electron pairs generated within the photosensitive region. In other words, the device acts like a saturated transistor with a beta approximately one (1). Because of the improved linearity of the semiconductor device, the device can be configured in a circuit to provide substantially linear power amplification.

Figure 1:
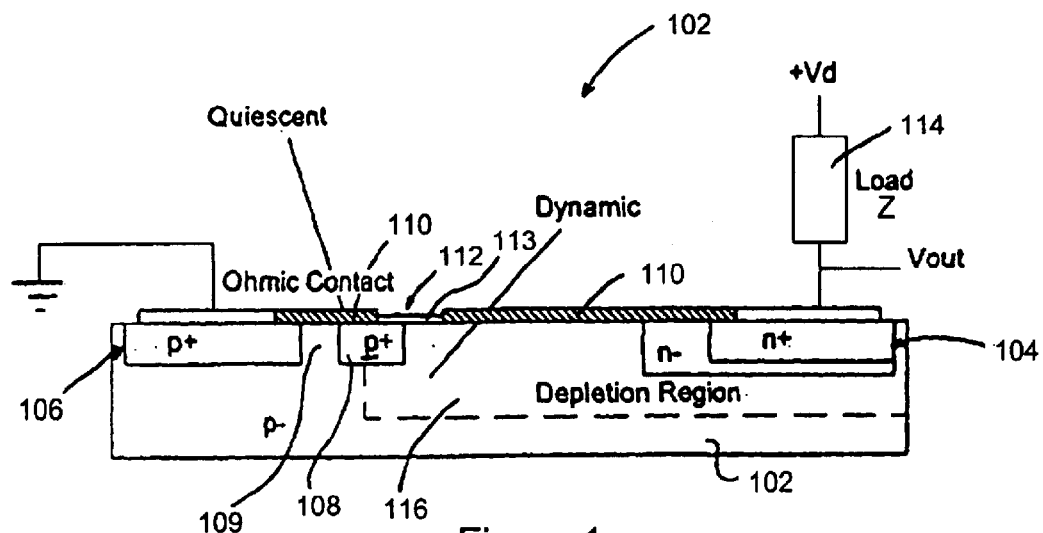
FIG. 1 illustrates a side sectional view of an exemplary semiconductor device in accordance with the invention.

FIG. 1 illustrates a side sectional view of an exemplary semiconductor device 100 in accordance with the invention. The semiconductor device 100 comprises a substrate 102. In the example semiconductor device illustrated, the substrate 102 has a relatively low p-doping (p−). An n-doped region 104, preferably comprising a relatively high doping (n+) and a relatively low doping region (n−), is formed within the substrate 102. Additionally, a relatively high p-doped region (p+) 106 is also formed within the substrate 102, spaced apart from the n-doped region 104. Interposed between the n-doped region 104 and the p-doped region 106 is a photosensitive material 108, which is preferably a relatively high-doped region (p+). The photosensitive region (p+) 108 is situated closer to the p-doped region (p+), but spaced apart therefrom to define a resistive region 109 between the photosensitive region 108 and the n-doped region.

The semiconductor device 100 further includes ohmic contacts on the surface of the substrate 102 for electrical connection to the n-doped 104 and p-doped regions 106. The semiconductor device 100 may also include optically reflective material 110 disposed on the surface of the substrate 102 with an opening 112 situated to allow an incident light to strike the photosensitive region (p+) 108. The reflective material 110 masks most of the p-n junction from the incident light, except for the photosensitive region (p+) 108. The semiconductor device 100 may further include a silicon nitride layer 113 or other suitable material within the opening 112 to optically impedance match between the silicon substrate 102 and the laser source interface. This can be air if we use a lens to focus or fiber optic/Si. In an exemplary application, the n-doped region 104 is electrically connected to a positive bias voltage (+Vd) by way of a load 114 and the p-doped region 106 is electrically connected to a ground potential (or negative voltage as compared to the positive bias voltage (+Vd)).

As typical of all p-n junctions, a depletion region 116 is formed between the n-doped region 104 and the p-doped region 106. The length of the depletion region depends on the doping concentrations, profiles of the dopants, and the reverse bias voltage (+Vd) applied across the p-n junction. To properly bias the semiconductor device 100, the reverse bias voltage (+Vd) is adjusted so that the depletion region 116 extends partially within the photosensitive region (+Vd) 108. In FIG. 1, the boundary of the depletion region 116 within the photosensitive region (p+) 108 is shown with a dash line.

In operation, when light (e.g. a laser) strikes the photosensitive region (p+) 108, the light energy generates hole-electron pairs from the partial diffusion region within the photosensitive region (p+) 108. The current generated in the photosensitive region in the p-n direction and near the surface of the substrate (where most of the current propagates) changes in proportion and substantially linear with the intensity of the light energy striking the photosensitive region (p+) 108. Thus, the light energy can modulate the current through the semiconductor device 100 between the n-doped region 104 to the p-doped region 106. This characteristic of the semiconductor device 100 makes it particularly useful for signal amplification applications. Because of the linearity of the variation of the current with the light intensity, the semiconductor device 100 is particularly useful for power amplification where substantial linearity is desired. For instance, in the configuration shown in FIG. 1, the output voltage (Vout) varies substantially linear with the light intensity striking the photosensitive region (p+) 108.

Figure 2:
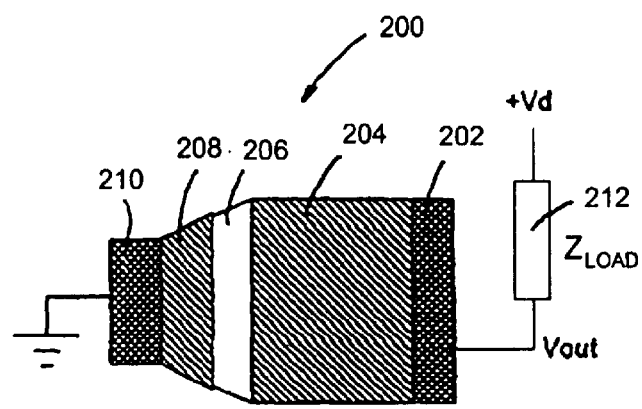
FIG. 2 illustrates a top sectional view of an exemplary semiconductor device in accordance with the invention.

FIG. 2 illustrates a top sectional view of an exemplary semiconductor device 200 in accordance with the invention. The semiconductor device 200 comprises an n-doped region 202, the diffusion region 204, a photosensitive region 206, a substantially constant resistive region 208, and a p-doped region 210. As with the embodiment shown in FIG. 1, the semiconductor device 200 may be connected across a bias voltage (+Vd) with a series impedance 212. For linearity purpose, it is desirable for the voltage reduction of the output voltage Vout to be equal to the voltage reduction across the photosensitive region (p+) 206 in response to a change in the incident light intensity. However, that would result in half of the desired output power to be dissipated within the channel. To ameliorate this problem, the semiconductor device 200 comprises a tapered channel extending from approximately the n-side of the photosensitive region (p+) 206 to the p-doped region 210. This configuration results in a higher resistance in the resistive region 208 than within the photosensitive region (p+) 206. Thus, the impact of the channel modulation on the output power is reduced.

Another technique to reduce the impact of the channel modulation on the output power is to provide a doping profile that is greater around the photosensitive region (p+) 206 than in the resistive region 208. This results in a higher resistance in the resistive region 208 than in the photosensitive region (p+) 206. Thus, the impact of the channel modulation on the output power is reduced.

Figure 3:
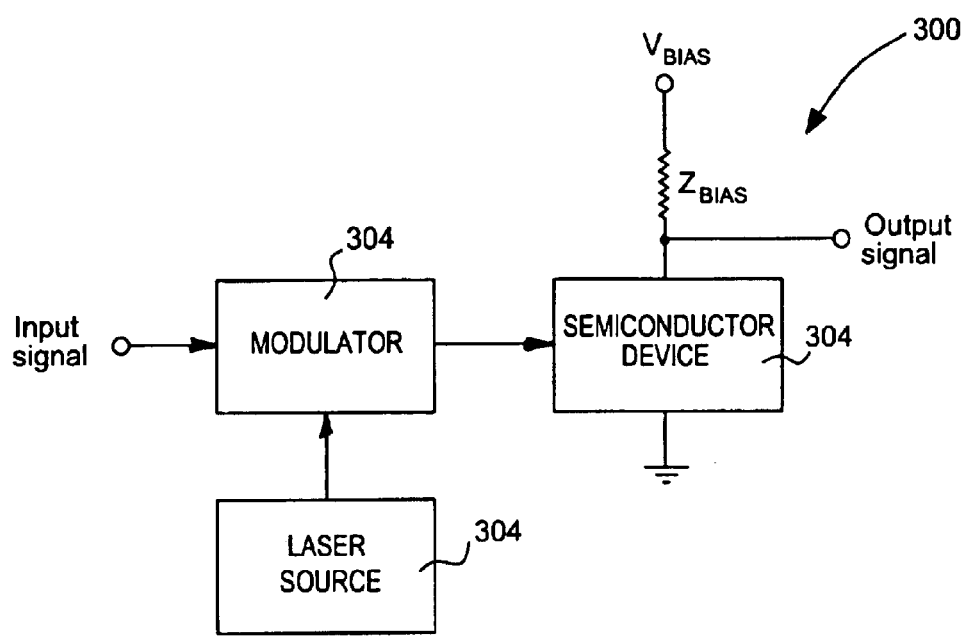
FIG. 3 illustrates a block diagram of an exemplary power amplifier (or stage) using the exemplary semiconductor device in accordance with the invention.

FIG. 3 illustrates a block diagram of an exemplary power amplifier (or stage) 300 in accordance with the invention. The power amplifier 300 comprises a modulator 302 for modulating a laser emitted from a laser source 304 with an input signal. It is apparent to those skilled in the art that the modulator 302 and laser source 304 can be one and the same, such as a laser diode (i.e. a laser diode can be modulated directly). The modulated laser is applied to the semiconductor device 306, such as the exemplary devices 100 and 200, that receives a bias voltage ($V_{bias}$) through a series bias impedance ($Z_{bias}$). The output voltage Vout is taken off the node between the bias impedance ($Z_{bias}$) and the semiconductor device 306. Because of the improved linearity of the semiconductor device 306, the power amplifier 300 consequently also has improved linearity. The power amplifier 300 is merely one application of many for the semiconductor device of the invention.

Figure 4:
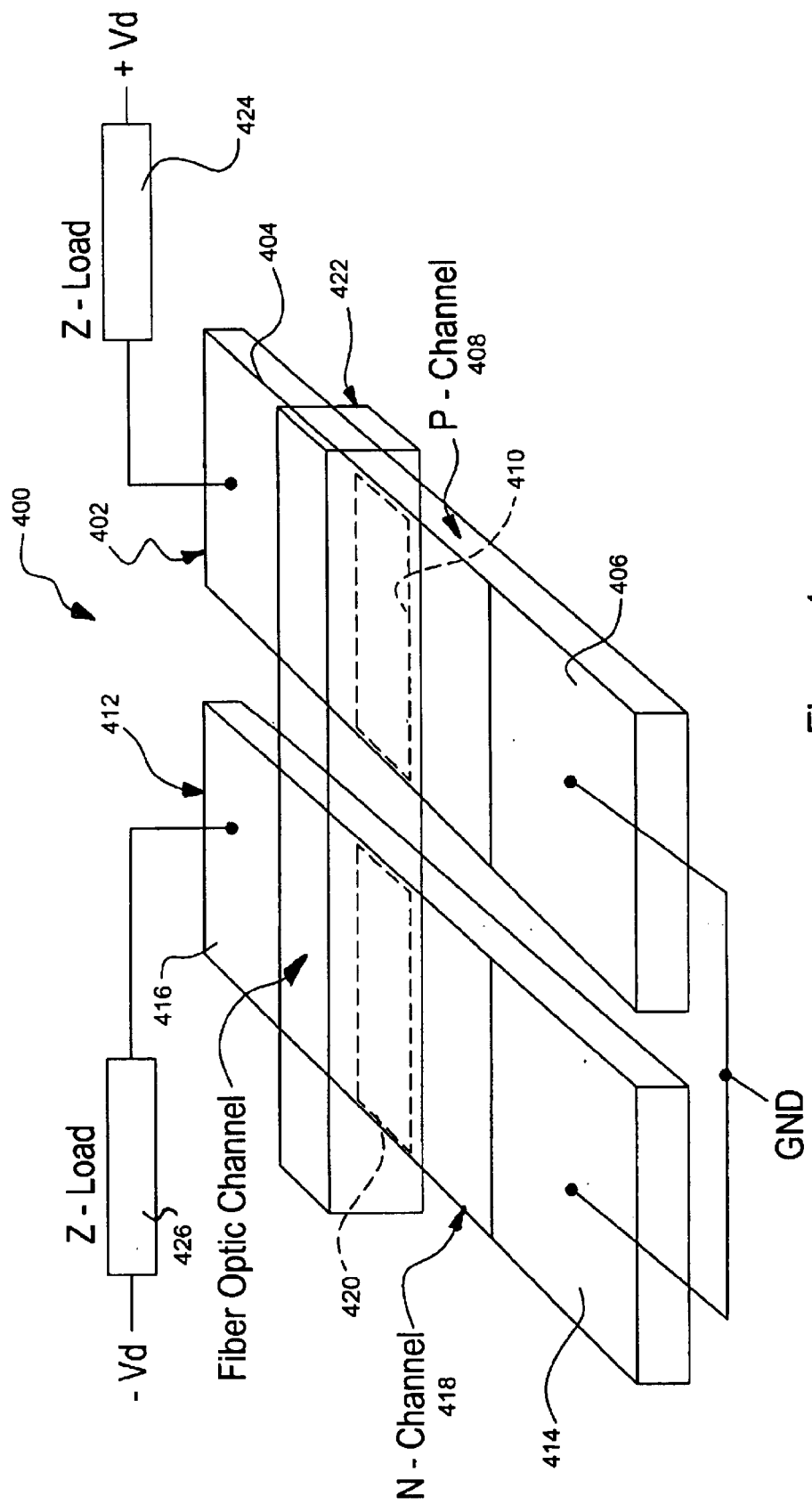
FIG. 4 illustrates a perspective view of exemplary complimentary semiconductor devices in accordance with the invention.

FIG. 4 illustrates a perspective view of exemplary complimentary semiconductor devices 400 in accordance with the invention. The complimentary devices 400 comprises two semiconductor devices, such as semiconductor devices 100 and 200, except that one of the devices is configured with an n-channel instead of a p-channel. More specifically, the complimentary devices 400 comprises a p-channel semiconductor device 402 that includes an n-doped region 404, a p-doped region 406, and a p-doped channel 408 (e.g. formed using a p-doped substrate).

The p-channel semiconductor device 402 further includes a photosensitive region comprising a relatively highly p-doped region 410 situated within the p-doped channel 408. The complimentary devices 400 further comprises an n-channel semiconductor device 412 that includes an n-doped region 414, a p-doped region 416, and an n-doped channel 418 (e.g. formed using an n-doped substrate). The n-channel semiconductor device 412 further includes a photosensitive region comprising a relatively highly n-doped region 420 situated within the n-doped channel 418. An optical fiber 422 coupled to respective photosensitive regions 410 and 420 of the p- and n- devices 402 and 412 may be included to provide a modulated light signal to these regions.

The complimentary semiconductor devices 400 are arranged in a push-pull configurations. That is, the p-doped region 406 of the p-channel semiconductor device 402 and the n-doped region 414 of the n-channel semiconductor device 412 are both electrically connected in common to a ground potential. The p-channel semiconductor device 402 is biased with a positive voltage (+Vd) applied to the n-doped region 404 of the semiconductor device 402 by way of a series impedance element 424, and the n-channel semiconductor device 412 is biased with a negative voltage (−Vd) applied to the p-doped region 416 of the semiconductor device 412 by way of a series impedance element 426. An optical signal applied to the complimentary devices 400 through the fiber optic channel will cause a push-pull operations of the complimentary devices 400.

Figure 5:
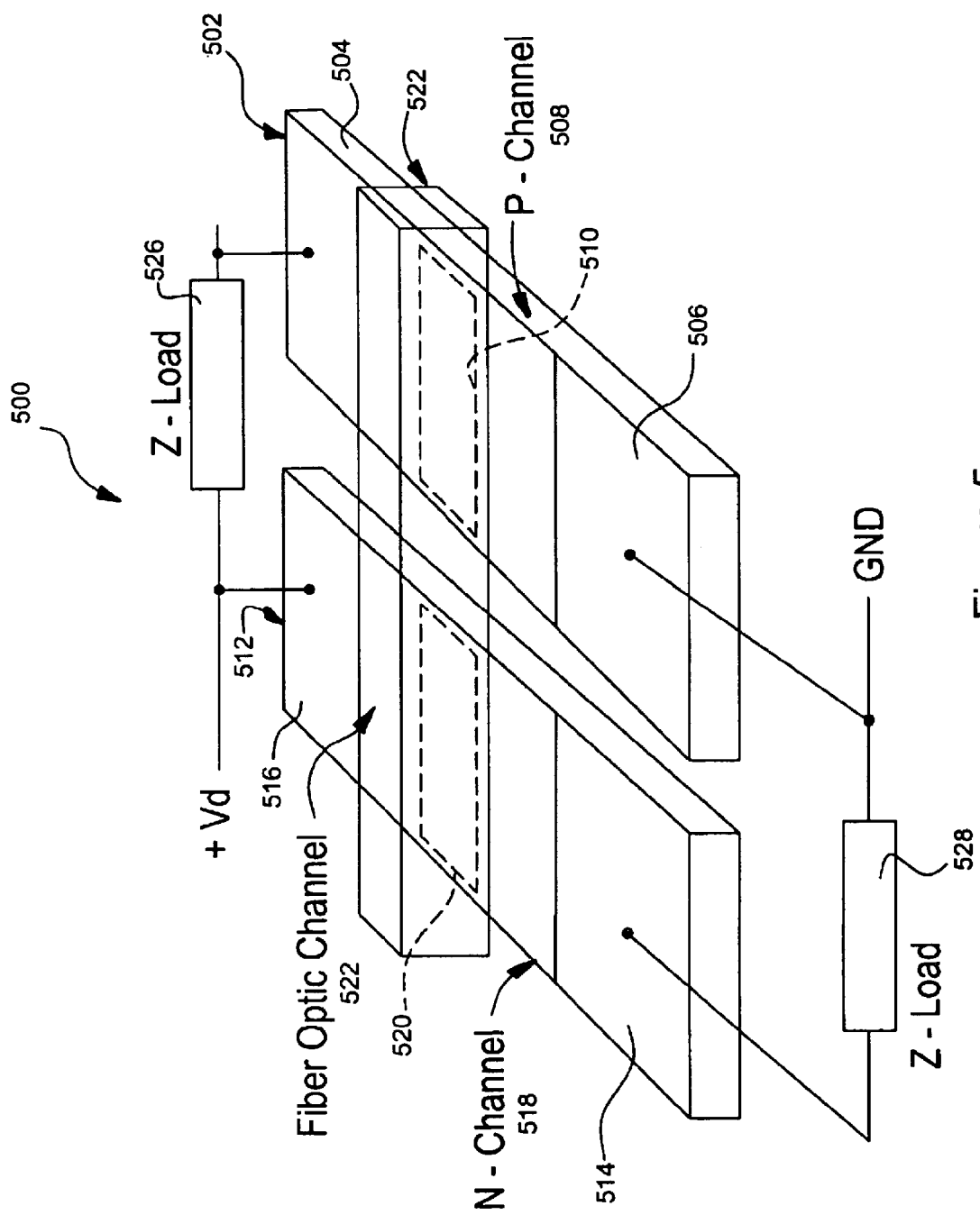
FIG. 5 illustrates a perspective view of another exemplary semiconductor devices in a push-pull configuration in accordance with the invention.

FIG. 5 illustrates a perspective view of exemplary semiconductor devices 500 in a push-pull configuration in accordance with the invention. The push-pull configured semiconductor devices 500 comprise two semiconductor devices 502 and 512 of the type described herein with reference to FIG. 1, except that device 512 is configured with an n-channel instead of a p-channel.

More specifically, the semiconductor device 502 comprises an n-doped region 504, a p-doped region 506, and a p-doped channel 508 (e.g. formed using a p-doped substrate). The p-channel semiconductor device 502 further includes a photosensitive region comprising a relatively high p-doped region 510 situated within the p-doped channel 508.

The n-channel semiconductor device 512 comprises an n-doped region 516, a p-doped region 514, and an n-doped channel 518 (e.g. formed using an n-doped substrate). The n-channel semiconductor device 512 further includes a photosensitive region comprising a relatively high n-doped region 520 situated within the n-doped channel 518. An optical fiber 522 coupled to respective photosensitive regions 510 and 520 of the p- and n-devices 502 and 512 may be included to provide a modulated light source to these regions.

The semiconductor devices 500 are arranged in a push-pull configuration using a single power supply voltage (+Vd). The push-pull configured semiconductor devices 500 comprise a first impedance load 526 connected to the positive power supply voltage (+Vd) and the n-doped region 516 of the n-channel device 512 at one end, and to the n-doped region 504 of p-doped channel device 502 at the other end. The push-pull semiconductor devices 500 further comprise a second impedance load 528 connected to the p-doped region 514 of the n-channel device 512 at one end, and to the p-doped region 506 of the p-channel device 502 and ground at the other end.

The power supply voltage (Vd) can also be negative with respect to ground. In this case, the polarity of the semiconductors would be reverse. That is, the n- and p-doped regions 516 and 514 of the n-channel device 512 would be p- and n-doped regions, respectively. Likewise, the n- and p-doped regions 504 and 506 of the p-channel device 508 would be p- and n-doped regions, respectively.

Figure 6:
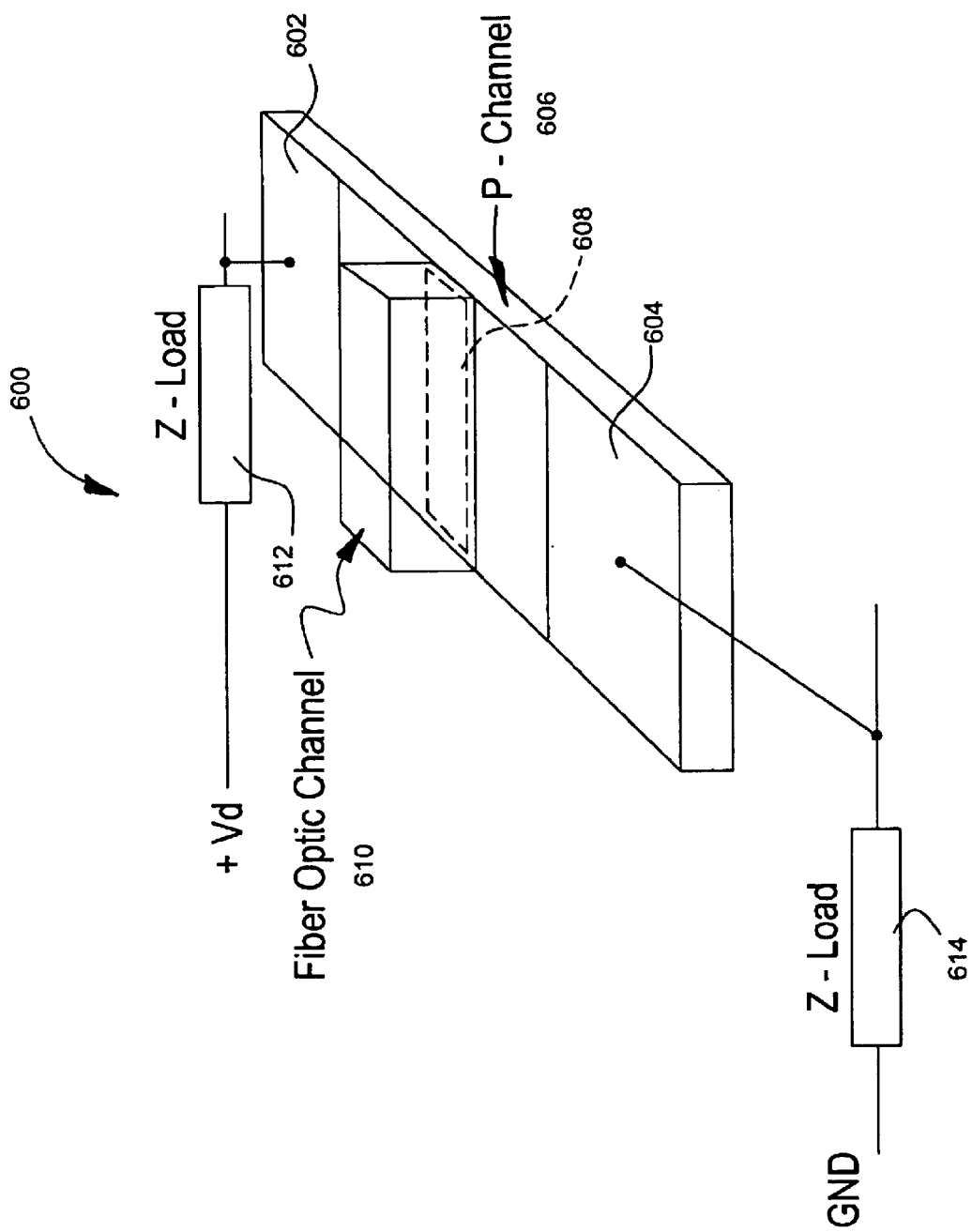
FIG. 6 illustrates an exemplary semiconductor device that is also in a push-pull configuration in accordance with the invention.

FIG. 6 illustrates an exemplary semiconductor device 600 that is also in a push-pull configuration in accordance with the invention. The push-pull configured semiconductor device 600 is of the type described herein with reference to FIG. 1. Specifically, the semiconductor device comprises an n-doped region 602, a p-doped region 604, and a p-doped channel 606 situated between the n- and p-doped regions 602 and 604. The semiconductor device 600 further includes a photosensitive region comprising a relatively high p-doped region 608 situated within the channel 606. A fiber optic cable 610 may be included to provide a modulated optical signal to the photosensitive region 608.

The push-pull configured semiconductor device 600 further includes a first impedance load 612 connected to a positive supply voltage (+Vd) at one end and to the n-doped region 602 at the other end. Additionally, the push-pull configured semiconductor device 600 includes a second impedance load 614 connected to ground at one end and to the p-doped region 604 at the other end.

In operation, the modulated optical signal directed at the photosensitive region 608 by way of the fiber optic channel 610 generates holes-electron pairs in the region 608. The generated electrons flow toward the positive power supply voltage (+Vd), thereby supplying a current to the impedance load 612. Similarly, the generated holes flow towards the ground, thereby supplying a current to the impedance load 614. The opposite flowing currents produce the push-pull effect using a single device.

The supply voltage (Vd) may also be negative with respect to ground (or a voltage more positive than (Vd)). If this is the case, the generated electrons flow towards ground to supply current to impedance load 614, and the generated holes flow towards Vd to supply current to the impedance load 612. The push-pull semiconductor device may also be configured as an n-channel device.

In the foregoing specification, the invention has been described with reference to specific embodiments thereof. It will, however, be evident that various modifications and changes may be made thereto departing from the broader spirit and scope of the invention. The specification and drawings are, accordingly, to be regarded in an illustrative rather than a restrictive sense.

It is claimed:

1. A device, comprising:
    a first sub-device comprising:
        a p-doped substrate;
        a first n-doped region situated within said p-doped substrate;
        a first p-doped region situated within said p-doped substrate; and
        a first photosensitive region situated between said first n-doped region and said first p-doped region, within said p-substrate; and
    a second sub-device comprising:
        an n-doped substrate;
        a second n-doped region situated with said n-doped substrate;
        a second p-doped region situated within said n-doped substrate; and
        a second photosensitive region situated between said second n-doped region and said second p-doped region, within said n-substrate, wherein said first p-doped region is electrically coupled to said second n-doped region.

2. The device of claim 1, wherein said first n-doped region is electrically coupled to a positive power supply rail.

3. The device of claim 2, wherein said first n-doped region is electrically coupled to said positive power supply rail by way of a first resistive element.

4. The device of claim 1, wherein said second p-doped region is electrically coupled to a negative power supply rail.

5. The device of claim 4, wherein said second p-doped region is electrically coupled to said negative power supply rail by way of a resistive element.

6. The device of claim 1, wherein said first n-doped region is electrically coupled to a positive power supply rail by way of a first resistive element, and said second p-doped region is electrically coupled to a negative power supply rail by way of a second resistive element.

7. The device of claim 1, wherein said first p-doped region and said second n-doped region are electrically coupled to a ground potential rail.

8. The device of claim 1, further comprising a fiber optic channel coupled to said first and second photosensitive regions.

9. A device, comprising:
    a first sub-device comprising:
        a p-doped substrate;
        a first n-doped region situate within said p-doped substrate;
        a first p-doped region situated within said p-doped substrate; and
        a first photosensitive region situated between said first n-doped region and said first p-doped region, within said p-substrate; and
    a second sub-device comprising:
        an n-doped substrate;
        a second n-doped region situated within said n-doped substrate;
        a second p-doped region situated within said n-doped substrate; and
        a second photosensitive region situated between said second n-doped region and said second p-doped region, within said n-substrate, wherein said first p-doped region is electrically coupled to said second p-doped region.

10. The device of claim 9, wherein said first p-doped region is electrically coupled to said second p-doped region by way of a resistive element.

11. The device of claim 9, wherein said first n-doped region is electrically coupled to said second n-doped region.

12. The device of claim 11, wherein said first n-doped region is electrically coupled to said second n-doped region by way of a resistive element.

13. The device of claim 11, wherein said first p-doped region is electrically coupled to said second p-doped region by way of a first resistive element and said first n-doped region is electrically coupled to said second n-doped region by way of a second resistive element.

14. The device of claim 13, wherein said first p-doped region is electrically coupled to a ground potential rail, and said second n-doped region is electrically coupled to a positive power supply rail.

15. The device of claim 1, further comprising a fiber optic channel coupled to said first and second photosensitive regions.

16. A device, comprising:
    a first sub-device comprising:
        a first p-doped region;
        a first n-doped region; and
        a first p-doped photosensitive region to control a first current flowing from said first n-doped region to said first p-doped region in response to an optical signal; and a second sub-device comprising:
 a second p-doped region;
 a second n-doped region; and
 a second n-doped photosensitive region to control a second current flowing from said n-doped region to said second p-doped region in response to said optical signal.

17. The device of claim 16, further comprising a fiber optic channel to carry said optical signal, said fiber optic channel being coupled to said first and second photosensitive regions.

* * * * *